United States Patent
Byrn et al.

(10) Patent No.: US 6,871,154 B2
(45) Date of Patent: Mar. 22, 2005

(54) METHOD AND APPARATUS FOR AUTOMATICALLY CONFIGURING AND/OR INSERTING CHIP RESOURCES FOR MANUFACTURING TESTS

(75) Inventors: Jonathan Byrn, Kasson, MN (US); James Jensen, Eagan, MN (US); Roy Perrigo, Henrietta, NY (US); Donald Gabrielson, Rochester, MN (US)

(73) Assignee: LSI Logic Corporation, Milpitas, CA (US)

( * ) Notice: Subject to any disclaimer, the term of this patent is extended or adjusted under 35 U.S.C. 154(b) by 50 days.

(21) Appl. No.: 10/459,158

(22) Filed: Jun. 11, 2003

(65) Prior Publication Data

US 2004/0254755 A1 Dec. 16, 2004

(51) Int. Cl.$^7$ .................................. G06F 19/00
(52) U.S. Cl. .......................... 702/117; 438/14
(58) Field of Search ............... 702/117, 57, 60, 702/64, 65, 79, 118, 119, 120, 183, 186, 188; 710/17, 22, 29; 438/14, 17, 18

(56) References Cited

U.S. PATENT DOCUMENTS

| | | | | |
|---|---|---|---|---|
| 5,796,623 A | * | 8/1998 | Butts et al. ................ 703/23 |
| 6,633,999 B1 | * | 10/2003 | Lee ........................... 714/30 |
| 2002/0108006 A1 | * | 8/2002 | Snyder ...................... 710/100 |
| 2003/0055520 A1 | * | 3/2003 | Tomii ......................... 700/97 |
| 2003/0188208 A1 | * | 10/2003 | Fung ......................... 713/320 |

* cited by examiner

Primary Examiner—Edward Raymond
(74) Attorney, Agent, or Firm—Suiter West PC LLO

(57) ABSTRACT

The present invention is directed to a method and an apparatus for automatically configuring and/or inserting chip resources for manufacturing tests. A maximum test configuration ("test backplane") for all IP blocks is created and loaded into a tool suite. When a user issues a request to consume some IP blocks, the request may be checked for legality within the "test backplane". If a test resource (IP block) is not available for activation, then either the test resource may not be activated or the conflicting resource problem must be resolved so that the test resource may be activated. This may avoid late design surprises. The resources on the platform may already have test structures associated with them. All of these test structures may be associated with the "test backplane". These pre-exiting test structures may then be connected.

21 Claims, 11 Drawing Sheets

METHOD AND APPARATUS FOR AUTOMATICALLY CONFIGURING AND/OR INSERTING CHIP RESOURCES FOR MANUFACTURING TESTS

FIELD OF THE INVENTION

This invention relates generally to VLSI chip design technology, and particularly to a method and apparatus for automatically configuring and/or inserting chip resources for manufacturing tests.

BACKGROUND OF THE INVENTION

VLSI circuit complexity has made testing difficult and more expensive. Increasing the testability of a design becomes one of the important issues in the design cycle of VLSI circuits because it helps to achieve the high test quality and to reduce test development and test application costs. In the past, it was possible to add design-for-testability (DFT) circuits manually after logic synthesis. However, current needs for a shorter time to market make this approach an unaffordable design bottleneck. Ignoring DFT during the design cycle affects product quality and introduces schedule delays. Therefore, most industrial digital designs use automated synthesis, and DFT may be achieved by incorporating test and synthesis into a single methodology that is as automated as possible. Indeed, considering testability during the design synthesis, as opposed to traditional approaches of making back-end modification after an implementation has been generated, may significantly reduce design time.

Programmable platform architectures for VLSI chip design provide a set of resources (IP) to help facilitate the different chip designs that are applied to the platform. Typically this involves the integration of complex IP (intellectual property), which is challenging from a point view of the manufacturing test and test insertion. When such complex IP is used, there is often a very significant effort and schedule involved with the insertion, validation and test bringup of such IP in the manufacturing environment. In addition, in a platform environment it is often the case that not all of the platform resources are used. In such cases, these unused resources do not require testing and must be rendered inert relative to the rest of the system. If the unused resource cannot be made inert, then it must be instantiated for at least test purposes. However, this may complicate the chip validation problem and reduce effective yield.

In order to solve the foregoing problems, in the past DFT circuits (testing structures) were later inserted at a netlist level. However, this method may add months to a chip's schedule. Moreover, it is possible to discover that a design cannot be tested within the bounds of chip resources because of the limitations on available I/Os, power capacity, routing resources, timing closure, thermal issues, manufacturing tester limitations (such as pin location restrictions, max scan chains), and the like. Furthermore, this method may inject undetectable errors, and/or require significant and expensive late in the game design changes, which may literally set the design back to square 1 (this iteration loop may repeat itself over and over again).

Therefore, it would be advantageous to provide a method and apparatus to automatically configure where required, and/or insert where needed, chip resources for manufacturing tests in a way that is of minimal impact to the customer while facilitating the creation of manufacturing tests that are as sophisticated as they need to be.

SUMMARY OF THE INVENTION

Accordingly, the present invention is directed to a method and an apparatus for automatically configuring and/or inserting chip resources for manufacturing tests. According to an exemplary aspect of the present invention, a maximum test configuration ("test backplane") for all IP blocks (embedded or non-embedded) in a platform is precreated as part of the platform creation process. This may facilitate the factoring of physical effects into the base platform design with regard to a manufacturing test. The creation of this "test backplane" may resolve all IP and manufacturing test resource sharing issues at the beginning of the IC design process rather than at the end of it and may be performed outside of the critical schedule path. This maximum test configuration may be loaded into a tool suite (e.g., LSI Logic Corp.'s Rapid Builder tool suite, or the like) and may be used by all users of the platform.

When a user issues a request to consume resources from the platform, the request may be checked for legality within the "test backplane". If a test resource is not available for activation, then either the test resource may not be activated or the conflicting resource problem must be resolved so that the test resource may be activated. This preferably avoids late design surprises. The resources on the platform preferably already have test structures associated with them. All of these test structures are preferably associated with the test backplane. These pre-exiting test structures may then be connected. The RTL (register transfer level) connection step may be transparent to the user. However since the test structures are inserted from the very beginning of the IC design process, test validation and functional validation may be made effectively mutually independent without risk.

Since all of the structures are inserted in a known way with the requirement of the manufacturing tester incorporated, complex IP testing may be re-used, which significantly saves time and reduces risk in the test insertion step, in the manufacturing step, and in the manufacturing test creation step. When a user completes a design and turns it over to be completed/manufactured, individual IP tests may be re-used and reintegrated into the specific test(s) for this design. All unused resources are rendered inert and are thus not tested. Since all (or almost all) test issues are resolved ahead of time, the design may be "known" structurally testable. When done in conjunction with additional rules checking, the design may be "known" to be manufacturable from a test point of view. This preferably enhances quality and reduces cycle time again by reducing iterations.

The present invention also applies to non-platform environment and a standard ASIC design process.

It should be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
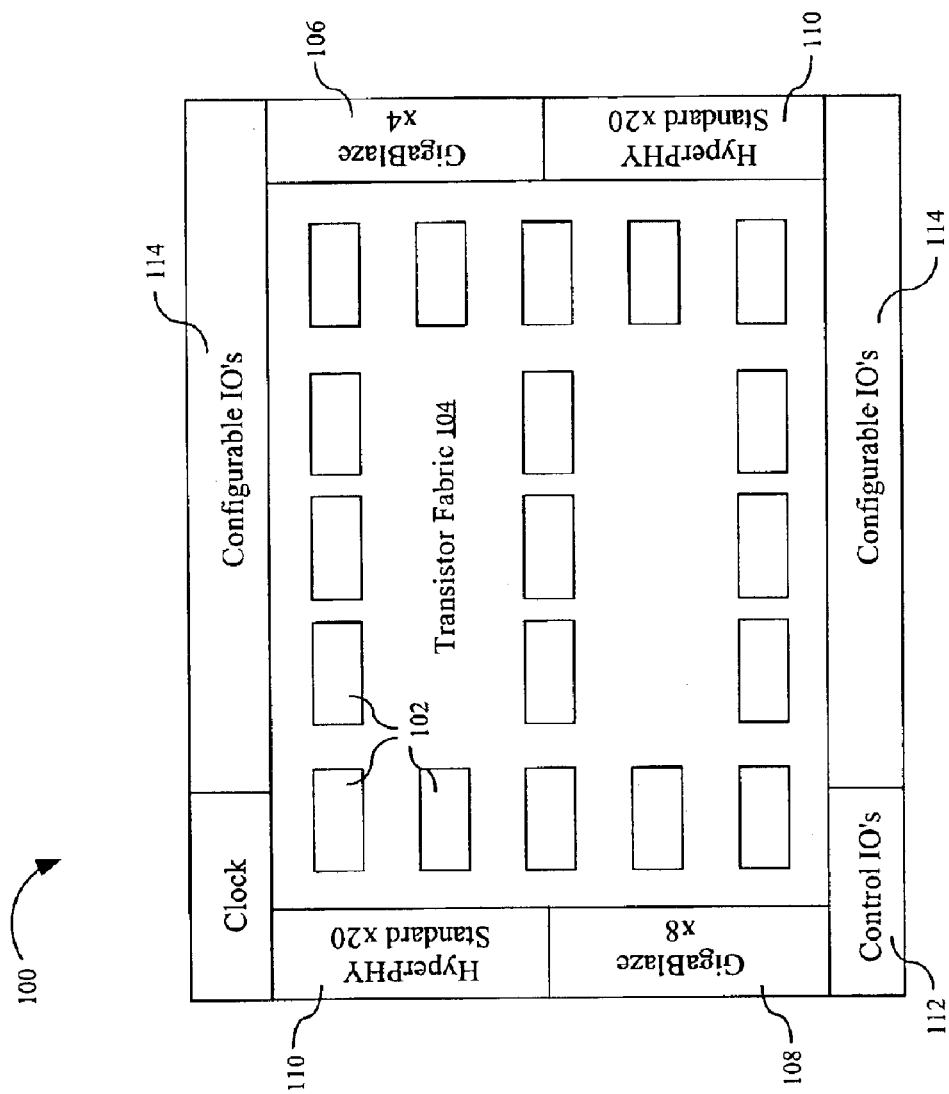
FIG. 1 is a schematic diagram illustrating an exemplary platform in which the present invention may be implemented.

Referring first to FIG. 1, a schematic diagram illustrating an exemplary platform 100 in which the present invention may be implemented is shown. The platform may include diffused memory blocks 102, a configurable transistor fabric 104, and hard IP (intellectual property) blocks such as a GigaBlaze® transceiver (x4) 106, a GigaBlaze® transceiver (x8) 108, two HyperPHY® transceivers 110, an embedded processor (not shown), and the like. The IO (input/output) ring of the platform 100 may be made up of control IO's 112 dedicated for specific requirements and configurable 10's 114. Soft IP (not shown) may be incorporated into the platform 100 as a function block and implemented in the transistor fabric 104 like any other block in the design, with specific timing criteria to ensure its functionality. The firm IP blocks (not shown) may be located anywhere within the transistor fabric 104. Firm IP may allow fully routed and characterized high-performance blocks to be incorporated into the platform based design.

Conventionally, a platform such as the platform 100 or the like has a set of resources (IP) to help facilitate the different chip designs that are applied to the platform. Typically this involves the integration of complex IP (intellectual property), which is challenging from a point view of the manufacturing test and test insertion. When such complex IP is used, there is often a very significant effort and schedule involved with the insertion, validation and test bringup of such IP in the manufacturing environment. In addition, in a platform environment it is often the case that not all of the platform resources are used. For example, a customer may not desire to incorporate both HyperPHY® transceivers 110 shown in FIG. 1 into her own product. In such cases, these unused resources do not require testing and must be rendered inert relative to the reset of the system. If the unused resource cannot be made inert, then it must be instantiated for at least test purposes.

It is understood that FIG. 1 is intended as an example of a platform in which the present invention may be implemented and not as an architectural limitation to the present invention. Those of ordinary skill in the art will appreciate that various combinations and arrangements may be employed without departing from the scope and; spirit of the present invention.

Figure 2:
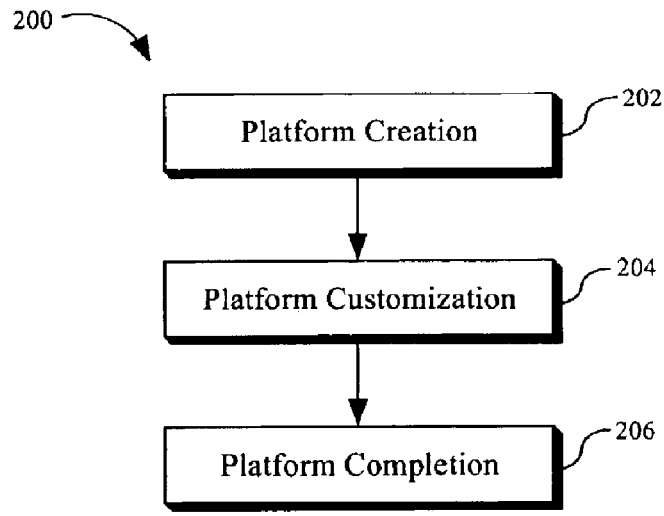
FIG. 2 is a flow chart illustrating three phases of an exemplary process for automatically configuring and/or inserting chip resources for manufacturing tests in accordance with the present invention.

FIG. 2 is a flow chart illustrating three phases of an exemplary process 200 for automatically configuring and/or inserting chip resources for manufacturing tests in accordance with the present invention. The process 200 includes three phases: phase 202 for platform creation, phase 204 for platform customization, and phase 206 for platform completion. In the phase 202, a test structure, a maximum test configuration, and/or reusable test vectors may be created. It is understood that multiple platforms may incorporate a certain IP block. When the IP block is used for the first time in platform development or even at the same time as platform development, the IP block may have its vector re-use and global test structure connections determined. This may help minimize the effort associated with multiple platform development and manufacturing test in manufacturing. In the phase 204, pre-existing test structure connection may be performed. In the phase 206, pre-defined tests may be assembled into a test program, and test program masking may be performed. Test program masking is the concept of intentionally ignoring test results that will not be good and that are already known do to the actual configuration (e.g., memory BIST, DDR Phy).

Figure 3:
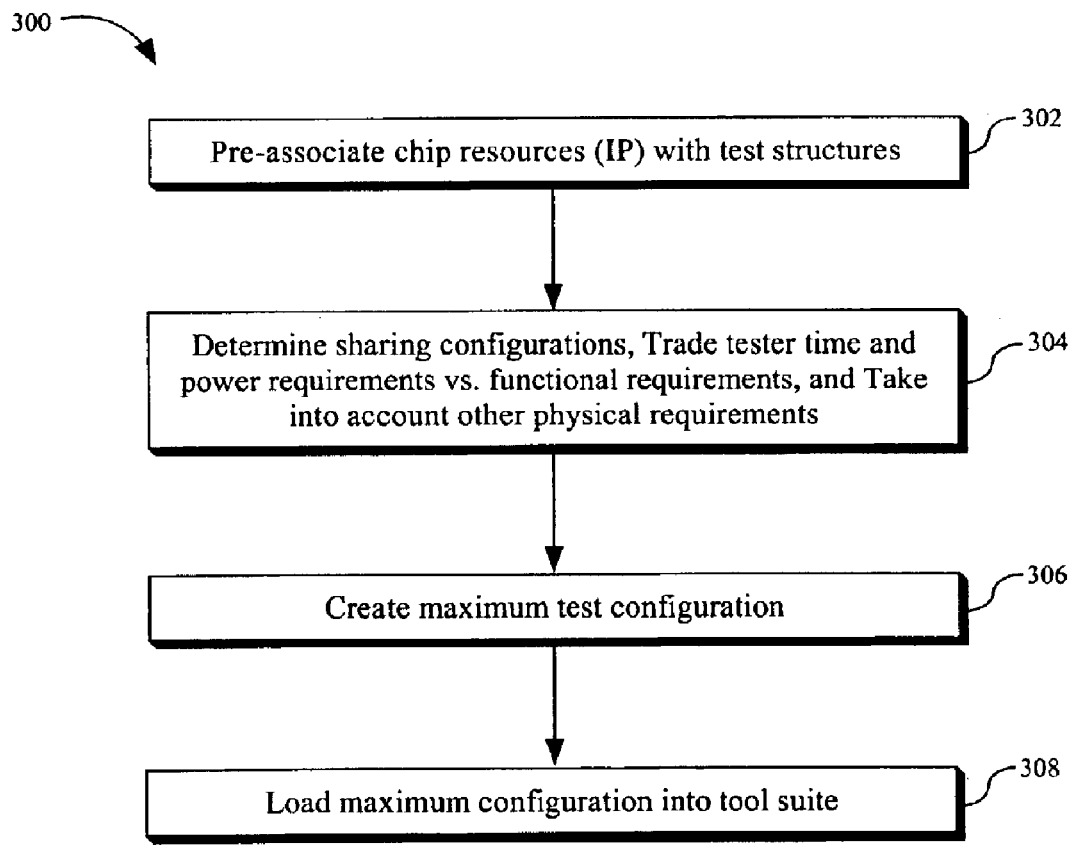
FIG. 3 is a flow chart illustrating an exemplary process for generating a maximum test configuration in accordance with the present invention.

FIG. 3 is a flow chart illustrating an exemplary process 300 for generating a maximum test configuration in accordance with the present invention. The generation of this test "backplane" may resolve all IP and manufacturing test resource sharing issues at the beginning of the development process rather than at the end of it. This maximum test configuration may then be used by all users of the platform to customize the platform. In addition, the process 300 may be performed outside of the critical schedule path. The process 300 may be implemented during the platform creation phase 202 shown in FIG. 2.

Figure 4:
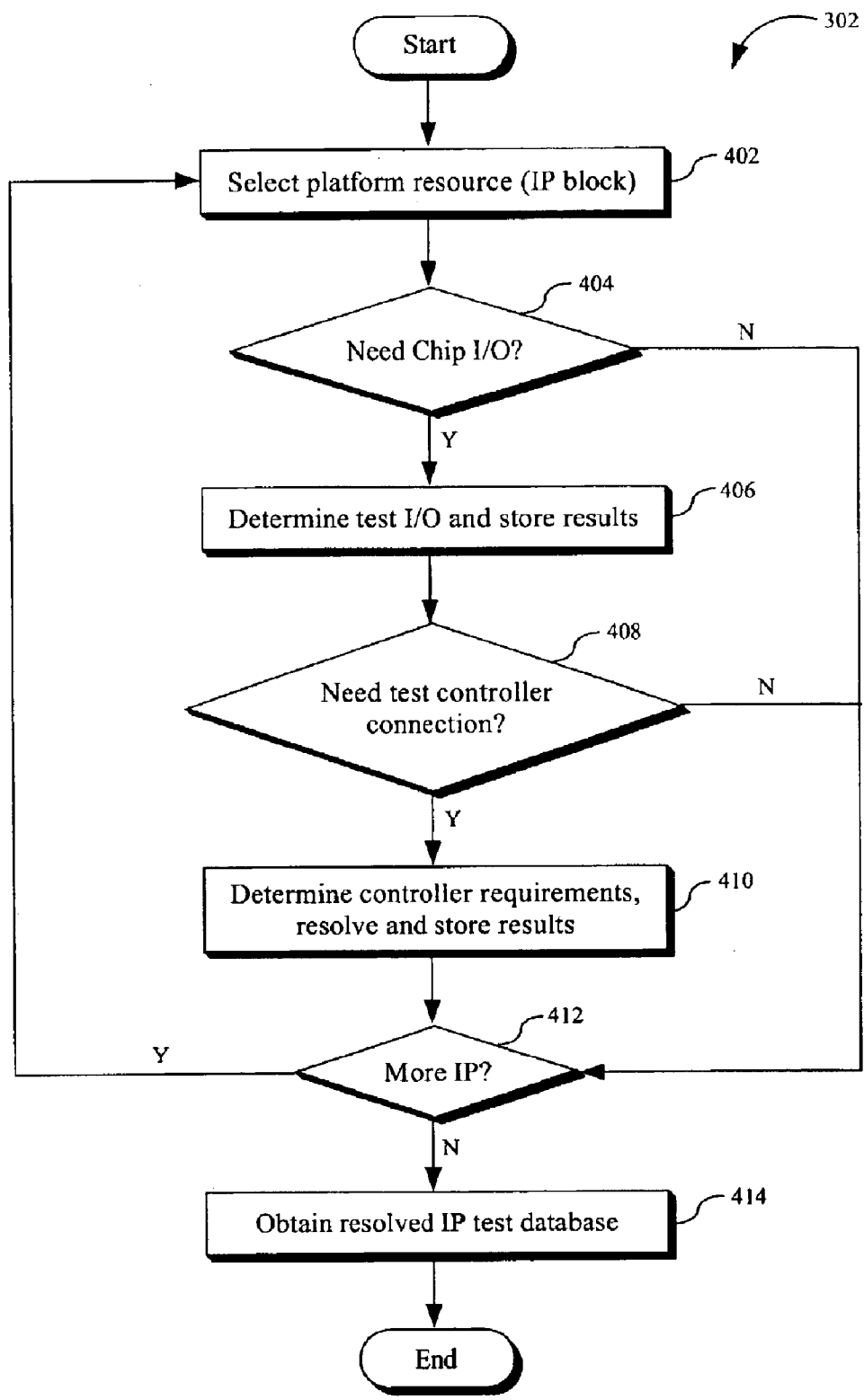
FIG. 4 is a flow chart showing an exemplary process for implementing step 302 shown in FIG. 3 in accordance with the present invention.

The process 300 may start with step 302 in which chips resources of a platform are pre-associated with test structures. FIG. 4 is a flow chart showing an exemplary process for implementing the step 302 in accordance with the present invention. The step or process 302 starts with step 402 in which a platform resource (IP block) is selected. Then in step 404, an inquiry is held to see if the selected IP block needs chip I/O's. If the answer to the inquiry in the step 404 is yes, then in step 406 test I/O's are determined, and the results are stored in an IP test database. Next in step 408, a further inquiry is held, to see if the selected IP block needs test controller connection. If the answer to the inquiry in the step 408 is yes, then in step 410 controller requirements are determined and resolved, and the results are stored in the IP test database. In the step 410, the connection between the selected IP block and a TAP controller may be identified, memory BIST collars and controllers may be identified and associated, and IP level LBIST/Selftest may also be identified and associated. Next, in step 412 an additional inquiry is held to see if there is any more IP block which has not gone through the process 302. It is noted that if the answer to the inquiry in the step 404 or the step 408 is no, then the process 302 proceeds directly to the step 412. If the answer to the inquiry in the step 412 is yes, then the process 302 returns to the step 402. If the answer to the inquiry in the step 412 is no, then in step 414 a resolved IP test database is obtained.

Now referring back to FIG. 3, following the step 302, in step 304 sharing configuration may be determined. For example, it may be determined that four GigaBlaze® transceivers shown in FIG. 1 share one GigaBlaze® test I/O slot.

Figure 5:
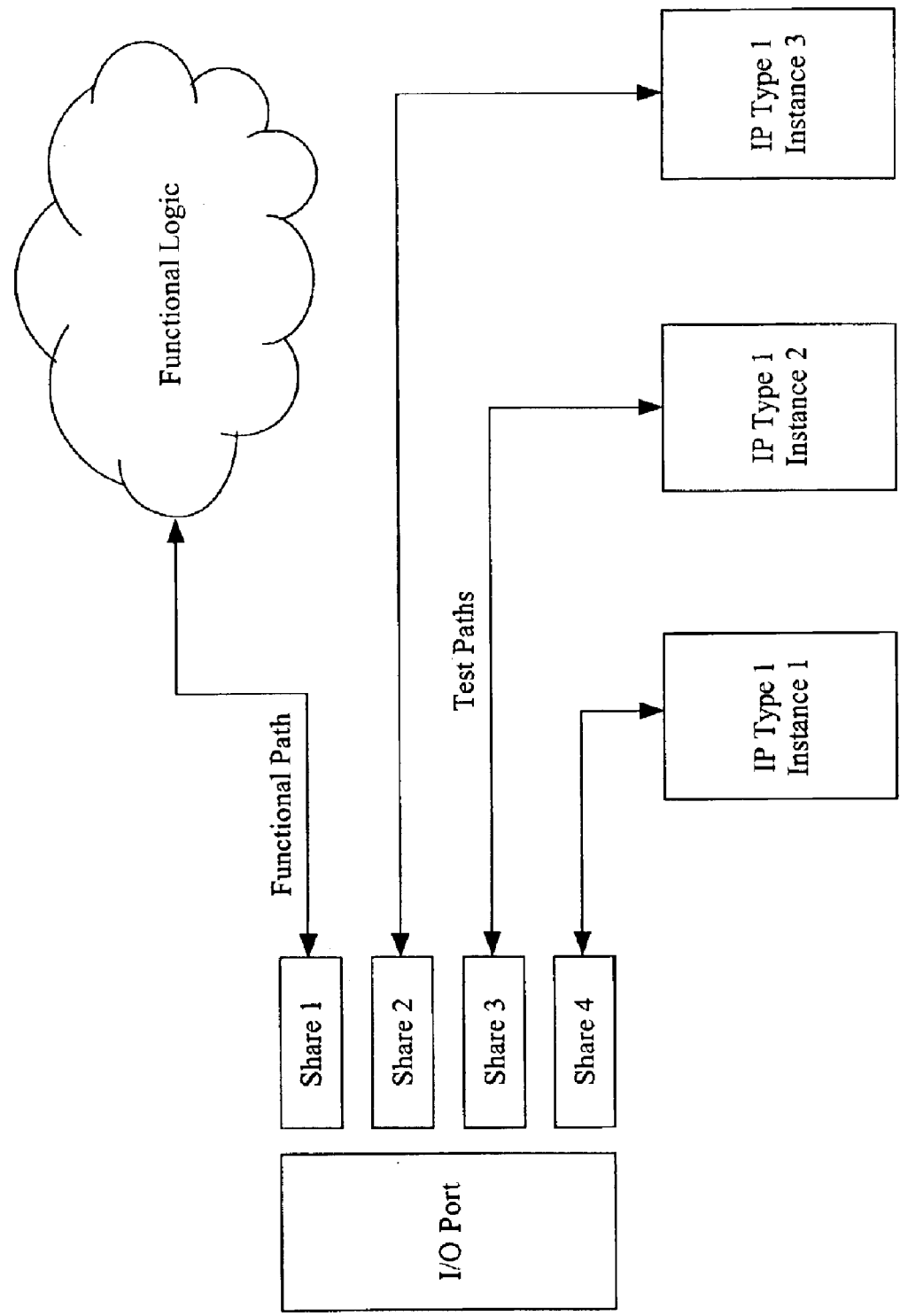
FIG. 5 is a schematic block diagram showing an exemplary resource sharing scheme in accordance with the present invention.

FIG. 5 is a schematic block diagram showing an exemplary resource sharing scheme in accordance with the present invention. In FIG. 5, the degree of sharing resources may be pre-set, and the pre-association of chips resources with test structures may be implemented in the step 302 shown in FIG. 3. It is understood that resources for sharing do not necessarily all belong to the same type of IP. In one embodiment, resources for sharing are test pins that are from mutually exclusive test modes.

In the step 304 shown in FIG. 3, tester time and power requirements may be, traded against tester functional requirements, and other physical requirements may be taken into account. These physical requirements may include tester power delivery (max current without droop), scan chain location (also other test signals) restrictions, limited pin count testing restrictions, max voltage planes, pattern buffer size, max tester frequency, and the like.

Figure 6:
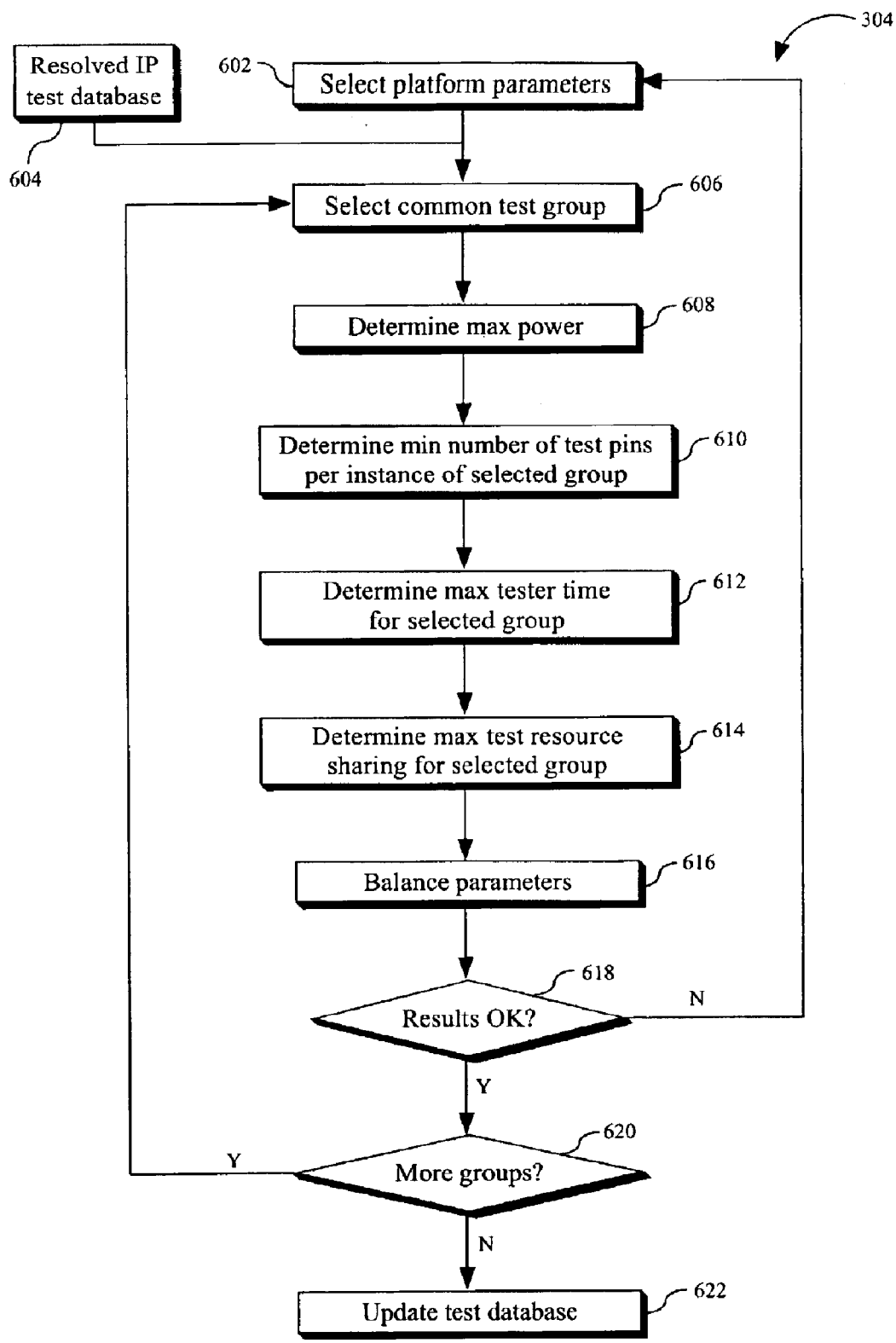
FIG. 6 is a flow chart showing an exemplary process for implementing step 304 shown in FIG. 3 in accordance with the present invention.

FIG. 6 is a flow chart showing an exemplary process for implementing the step 304 shown in FIG. 3 in accordance with the present invention. The process or step 304 starts with step 602 in which platform (or chip) parameters are selected. These platform parameters may include tester time, max power, total pins, user pins, test pins, and the like. Next in step 606, a common test group may be selected. The common test group may include a group of memories, a group of Serdes, and the like. The step 606 may be implemented based on the selected platform parameters obtained from the step 602 and a resolved IP test data base 604. The resolved IP test data base 604 may be obtained from the step 414 shown in FIG. 4. Then in step 608 a max test power may be determined. Next in step 610, a minimum number of test pins may be determined for each instance of the selected group. Then in step 612 a maximum tester time for the selected group is determined. Next in step 614 a maximum test resource sharing for the selected group is determined. Then the determined parameters may be balanced against one another in step 616. Next in step 618 an inquiry may be held to see if the balancing results are satisfactory. If the answer to the inquiry in the step 618 is no, then the process 304 may return to the step 602. If the answer to the inquiry in the step 618 is yes, then the process 304 may proceed to a further inquiry in step 620 to see if there are any more groups which have not gone through the steps 606 through 620. If the answer to the inquiry in the step 620 is yes, then the process 304 may return to the step 606. If the answer to the inquiry in the step 620 is no, then in step 622 the IP test database 604 may be updated.

Referring back to FIG. 3, following the step 304, in step 306 a maximum test configuration ("test backplane") may be created. This is more than a single mapping of platform resources, especially with the inclusion of configurable I/O's.

Figure 7:
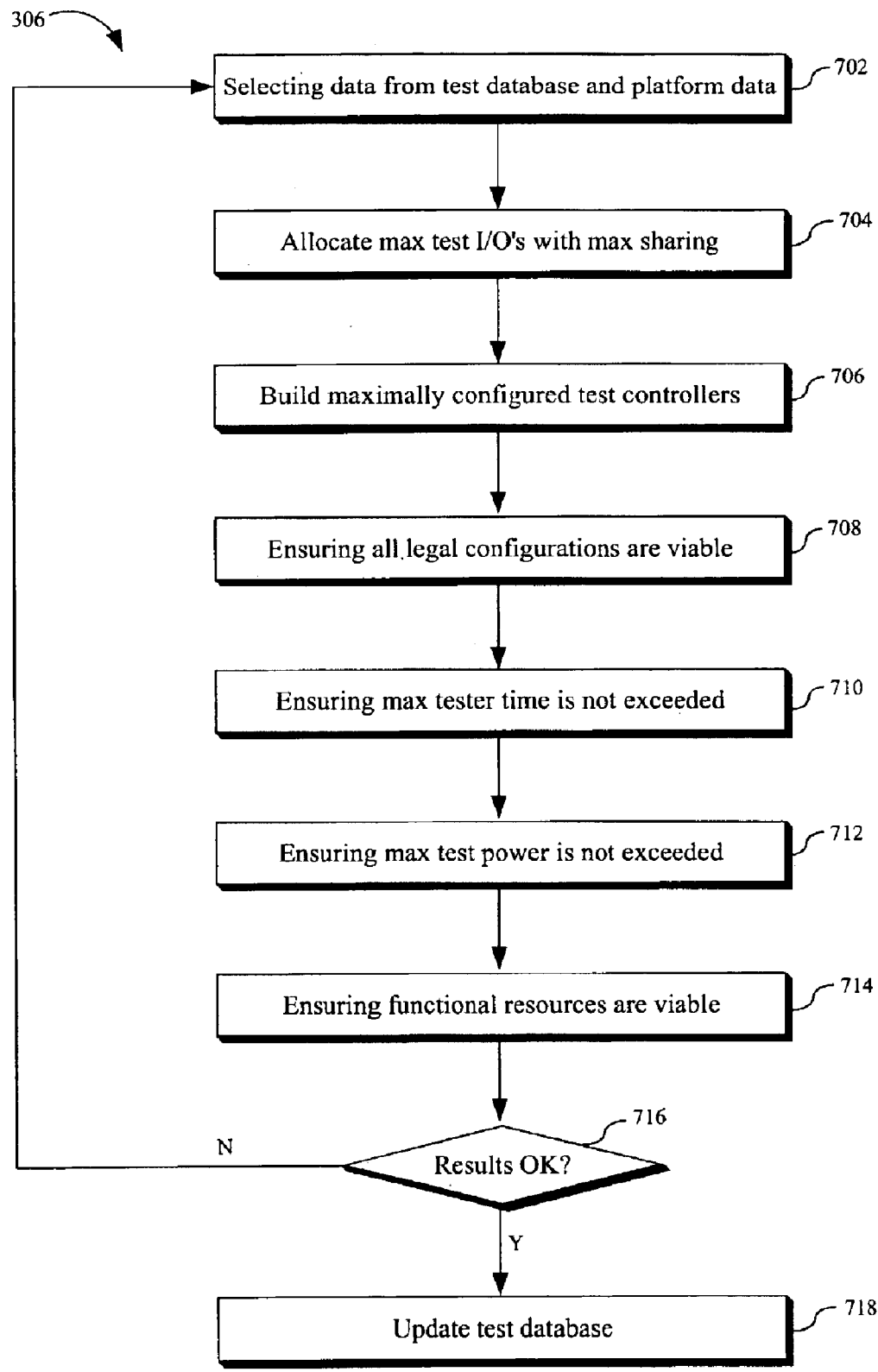
FIG. 7 is a flow chart showing an exemplary process for implementing step 306 shown in FIG. 3 in accordance with the present invention.

FIG. 7 is a flow chart showing an exemplary process for implementing the step 306 shown in FIG. 3 in accordance with the present invention. The process or step 306 may start with step 702 in which data from test database and platform (or chip) parameters are selected. The test database may be the updated test database obtained after the step 622 shown in FIG. 6. Next, in step 704 a maximum test I/O's with a maximum sharing may be allocated based on the data selected in the step 702. Then in step 706 maximally configured test controllers may be built. These test controllers may include TAP (test access port) controllers for test, pattern compressors, and the like. Next in step 708 all legal configurations may be ensured to be viable. Then in step 710 maximum tester time may be ensured not to be exceeded. Next maximum test power may be ensured not to be exceeded in step 712. Then in step 714 functional resources may be ensured to be viable. Next in step 716 an inquiry may be held to see if the results are satisfactory. If the answer to the inquiry in the step 716 is no, then the process 306 may return to the step 702. If the answer to the inquiry in the step 716 is yes, then the process 306 may proceed to step 718 in which test database may be updated.

Figure 8:
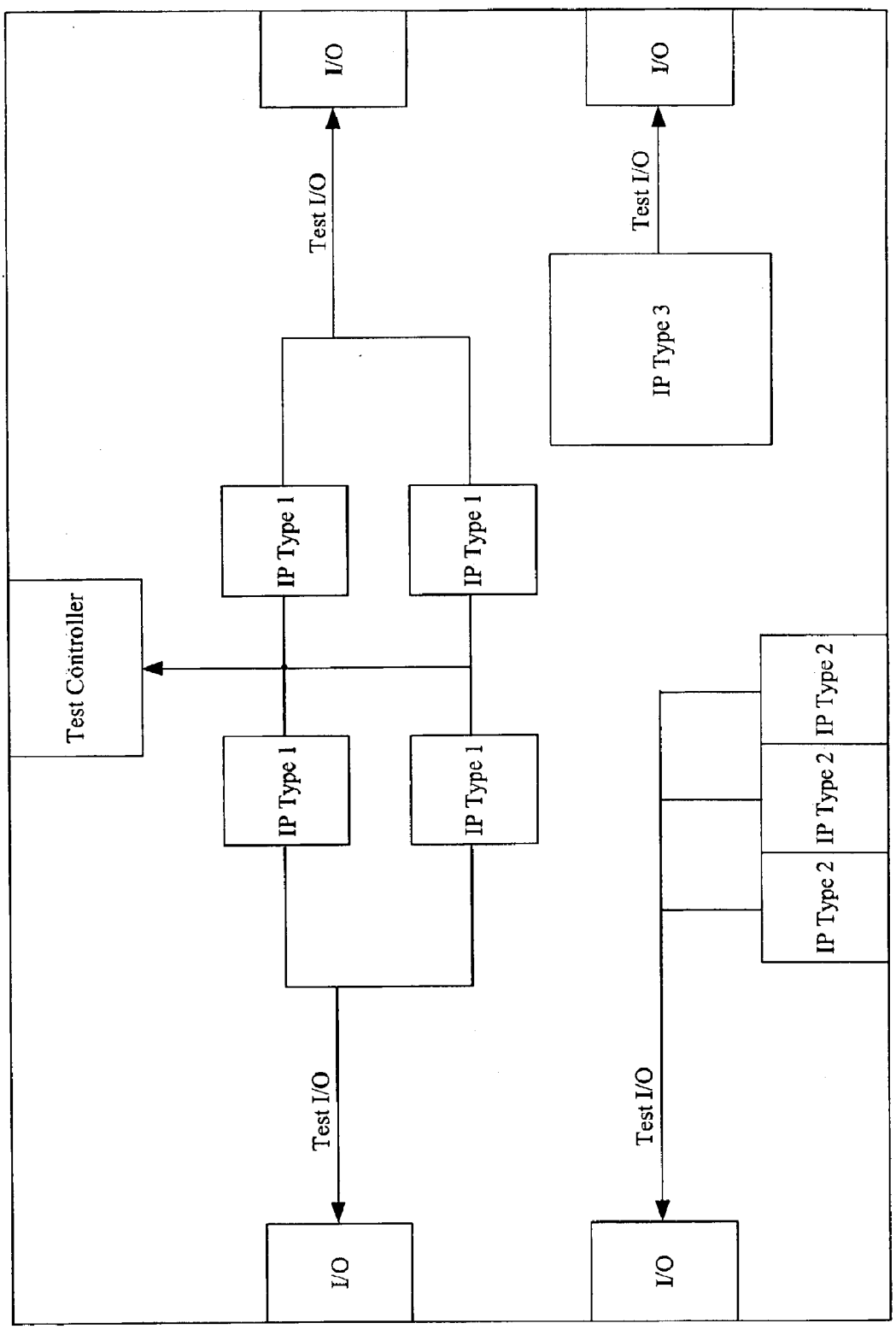
FIG. 8 is a schematic block diagram showing an exemplary maximum test configuration in accordance with the present invention.

FIG. 8 is a schematic block diagram showing an exemplary maximum test configuration in accordance with the present invention. As shown in FIG. 8, all possible IP test connections are resolved, and all platform resources possibly associated with test are identified. It is understood that resources for sharing do not necessarily all belong to the same type of IP. In one embodiment, resources for sharing are test pins that are from mutually exclusive test modes.

Now referring back to FIG. 3, following the step 306, the maximum test configuration generated in the step 306 may be loaded into a tool suite (e.g., a Rapid Builder tool suite developed by LSI Logic Corp, or the like.) so that a user may use it to customize the platform later.

Figure 9:
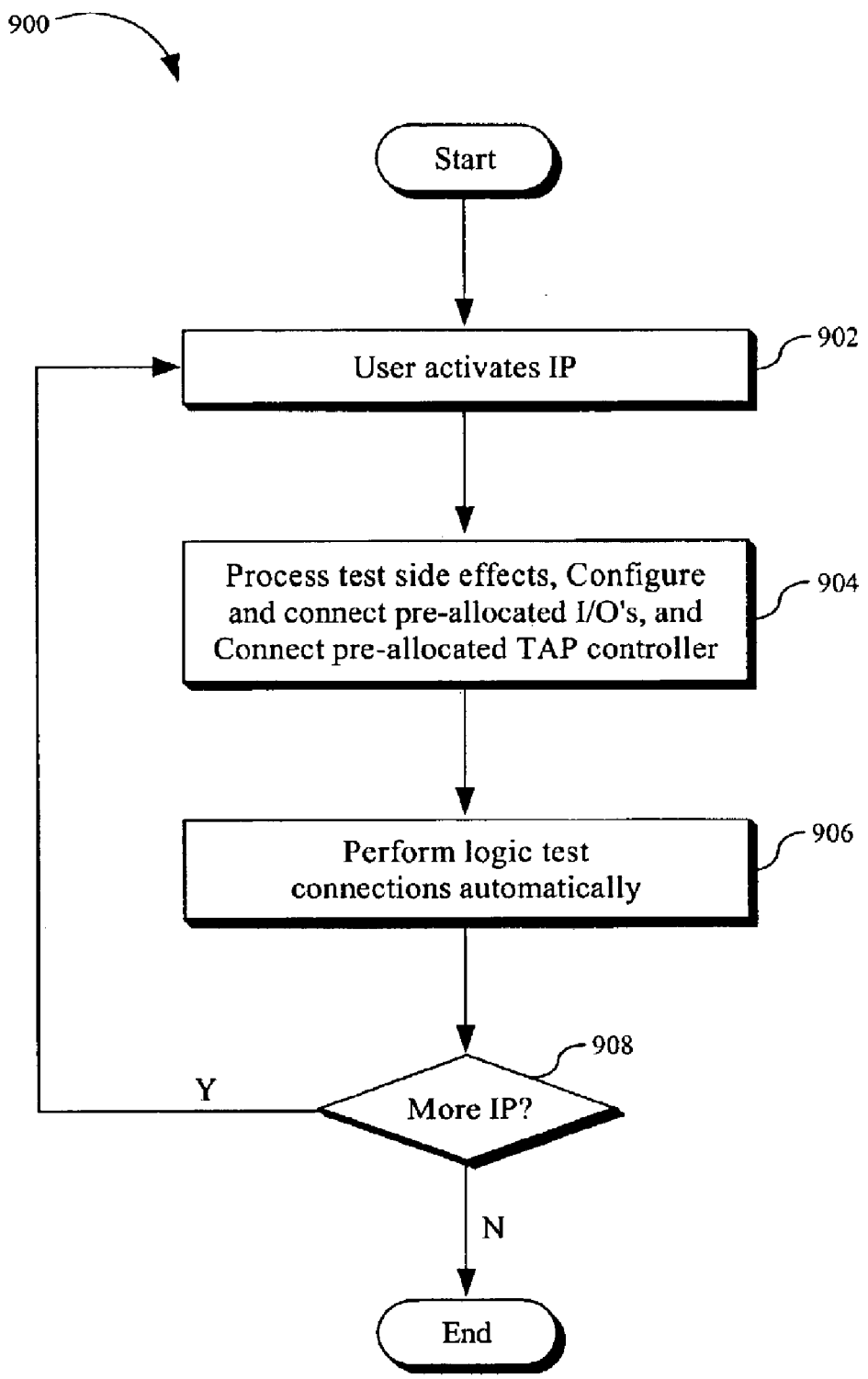
FIG. 9 is a flow chart illustrating an exemplary process for connecting pre-exiting test structures in accordance with the present invention.

FIG. 9 is a flow chart illustrating an exemplary process 900 for connecting pre-exiting test structures in accordance with the present invention. The process 900 may be implemented during the platform customization phase 204 shown in FIG. 2. After a user selects a platform, normally the user may not want to incorporate all LP blocks provided in the platform into her own product. Thus, those unused IP blocks do not need a manufacturing test. That is, the test elements need not be all activated by a user. A subset of the maximum test configuration may be selected by a user based on actual resources consumed.

The process 900 may start with step 902 in which an IP block is selected and activated. As a user activates an IP block, the manufacturing test structures may be created and/or managed in the background.

Next, in step 904, test side effects may be processed, pre-allocated I/O's may be configured and connected, and pre-allocated TAP controllers may be connected (to, e.g., 110 controls, memories, GigaBlaze®, Hyperphy®, Boundary Scan Ring, or the like). For example, when memory is activated, the memory may be connected to a "Super" TAP controller and perhaps one or more primary I/O's. This may cause a conflict in I/O connections, which must be resolved. In the case of a GigBlaze®, a connection to the "Super" TAP connection port for this GigaBlaze® may be made. In addition, a connection to a specific I/O for this GigaBlaze® also needs to be made. However, that I/O may have been consumed for other use. If these uses are incompatible, then either the GigaBlaze® cannot be activated, or the other functionality must be moved. Both of these options will cause ripple effects on the port lists of the hierarchy of the design. Moreover, when a user activates an I/O pre-defined for the manufacturing test, there may be restrictions placed on the I/O. For instance, a test clock may not be associated with a configurable differential I/O. Thus, if a user needs the test clock, the user may not be able to use that I/O as a configurable differential I/O. Thus, these test side effects must, be resolved.

Figure 10:
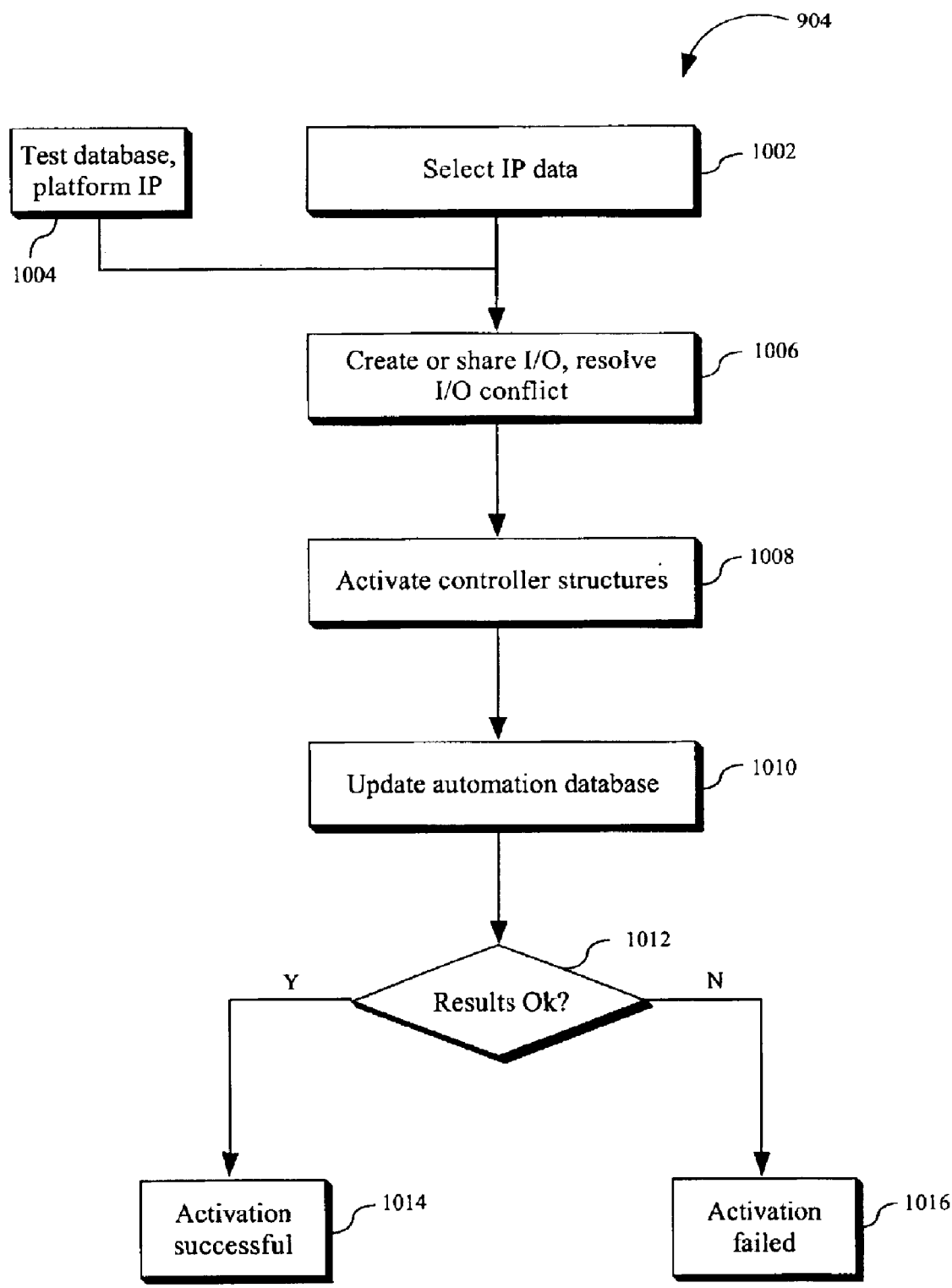
FIG. 10 is a flow chart showing an exemplary process for implementing step 904 shown in FIG. 9 in accordance with the present invention.

FIG. 10 is a flow chart showing an exemplary process for implementing the step 904 shown in FIG. 9 in accordance with the present invention. The step or process 904 may start with step 1002 in which IP data are selected. The selected IP data may include data associated with an LP block, including a hierarchical location in the design, an "index" which associates the IP block with a slot/location on the platform, and the like. The selected IP data may then be used together with test database and platform IP 1004 to create I/O or share I/O (if I/O is already used for other purposes) in step 1006. Also in the step 1006, resource conflicts (e.g., I/O conflicts) may be resolved. Next, in step 1008 controller structures may be activated. The controller structures may include the TAP controller(s) for test. Then in step 1010 automation database may be updated. Next, an inquiry may be held to see if the results are satisfactory in step 1012. That is, a user may check the result and determine if changes that are needed are satisfactory. For example, if a user needs to re-allocate an I/O, the user may want to ensure that the relocation is acceptable for a variety of reasons. For example, if a differential I/O is moved, the new location may be unacceptable from a broad level point of view, thus the user may wish to re-locate it again. Or the user may choose to activate a different but equivalent piece of IP (not shown in FIG. 10). If the answer to the inquiry in the step 1012 is yes, then activation is successful 1014; if the answer is no, then activation is failed 1016.

Referring back to FIG. 9, following the step 904, in step 906 logic test connections may be automatically performed. In a conventional ASIC design, test structures may be added later on. However, according to the present invention, test structures may be included within the design up front. Thus, what follows is not the insertion of test structures but the connection of test structures.

Figure 11:
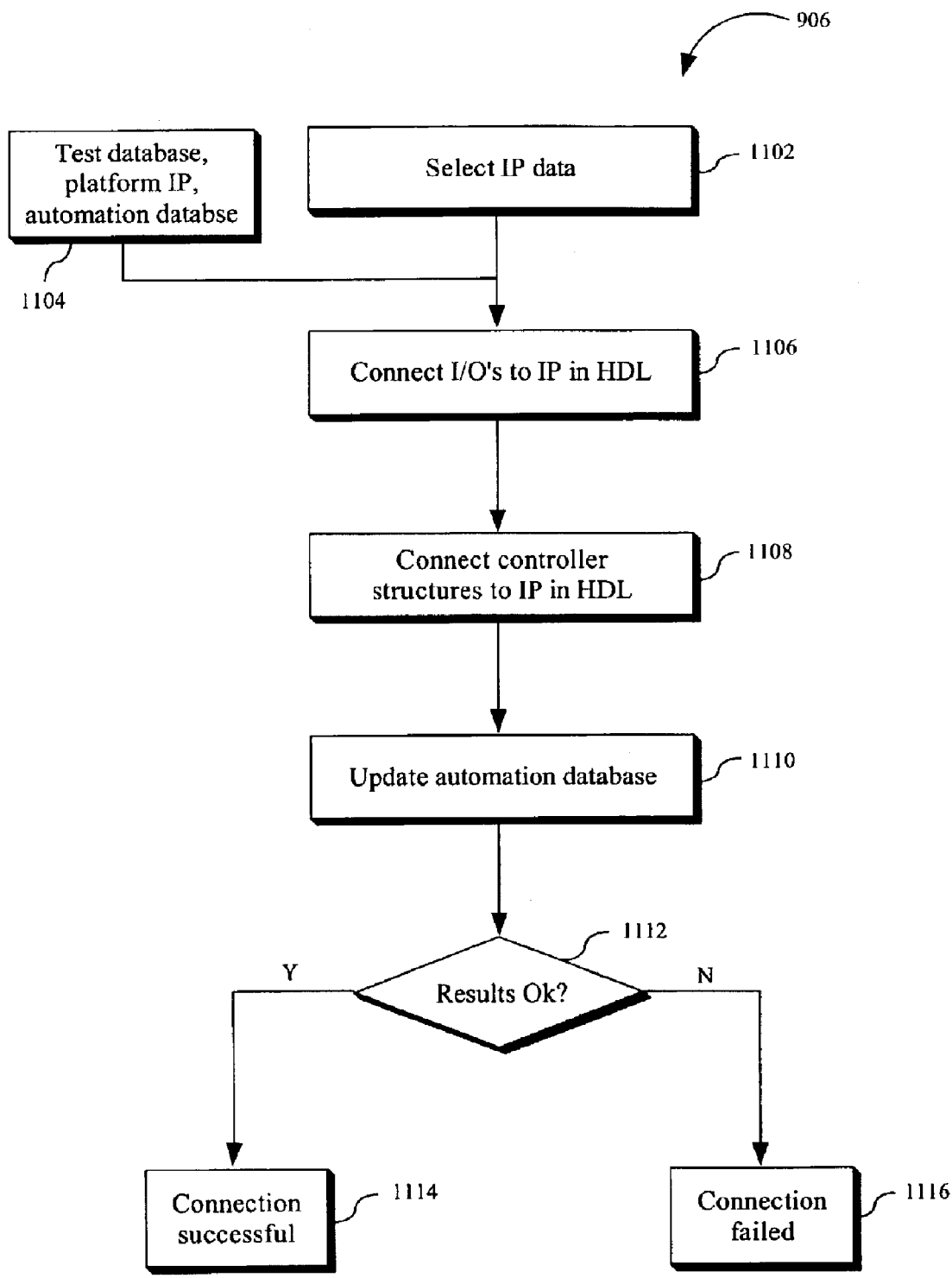
FIG. 11 is a flow chart showing an exemplary process for implementing step 906 shown in FIG. 9 in accordance with the present invention.

FIG. 11 is a flow chart showing an exemplary process for implementing the step 906 shown in FIG. 9 in accordance with the present invention. The step or process 906 may start with step 1102 in which 1P data are selected. The selected IP data may include data associated with an IP block, including a hierarchical location in the design, an "index" which associates the IP block with a slot/location on the platform, and the like. The selected IP data may then be used together with test database, platform IP and automation database 1004 to connect 110's to the selected IP in HDL (hardware description language) in step 1106. The automation database may be obtained in the step 1010 in FIG. 10. The step 1106 may be part tool driven and part manual or totally tool driven. Next, in step 1108 controller structures may be connected to the selected IP in HDL. The controller structures may include the TAP controller(s) for test. The step 1108 may be part tool driven and part manual or totally tool driven. Then, in step 1110 automation database may be updated. Next, an inquiry may be held to see if the results are satisfactory in step 1112. If the answer is yes, then the connection is successful 1114; if the answer is no, then the connection is failed 1116.

Now, referring back to FIG. 9, following the step 906, an inquiry may be held to see if there are any more IP blocks for use by the user in step 216. If the answer is yes, the process 900 may return to the step 902. If the answer is no, then the process 200 may end.

Figure 12:
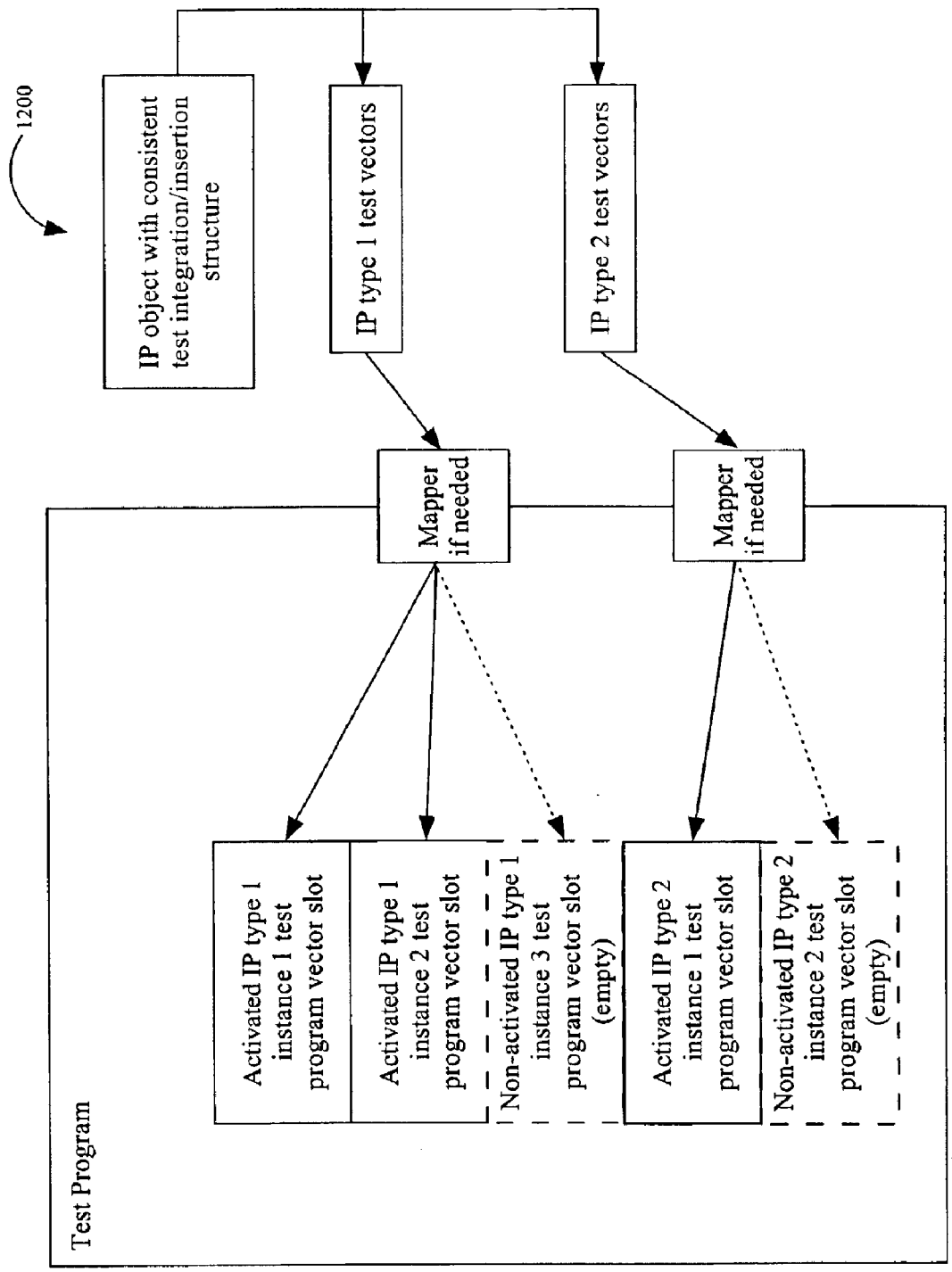
FIG. 12 is a block diagram showing an exemplary method for assembling pre-defined tests into a test program in accordance with the present invention.

FIG. 12 is a block diagram showing an exemplary method 1200 for assembling pre-defined tests into a test program in accordance with the present invention. The method 1200 may be implemented during the platform completion phase 206 shown in FIG. 2.

Those of ordinary skill in the art will understand that the present invention also applies to non-platform environment and a standard ASIC development process without departing from the scope and spirit of the present invention.

It is to be noted that the above described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of software package. Such a software package may be a computer program product which employs a storage medium including stored computer code which is used to program a computer to perform the disclosed function and process of the present invention. The storage medium may include, but is not limited to, any type of conventional floppy disks, optical disks, CD-ROMS, magneto-optical disks, ROMs, RAMs, EPROMs, EEPROMs, magnetic or optical cards, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for automatically configuring and/or inserting chip resources for a manufacturing test, comprising:
   (a) pre-associating chip resources with test structures;
   (b) determining sharing configuration, trading tester time and power requirements against tester's functional requirements, and taking into account physical requirements;
   (c) creating a maximum test configuration; and
   (d) loading said maximum test configuration into a tool suite.

2. The method of claim 1, wherein said step (a) comprising:
   (a1) selecting an IP block;
   (a2) determining test I/O's and storing a first result when said IP block requires one or more chip I/O's; and
   (a3) determining controller requirements, resolving and storing a second result when said IP block requires a test controller connection.

3. The method of claim 1, wherein said step (b) comprising:
   (b1) selecting chip parameters;
   (b2) selecting a common test group;
   (b3) determining maximum test power;
   (b4) determining a minimum number of test pins per instance of said common test group;
   (b5) determining maximum tester time for said common test group;
   (b6) determining maximum test resource sharing for said common test group;
   (b7) balancing said chip parameters; and
   (b8) modifying said chip parameters when a result of said step (b7) is not satisfactory.

4. The method of claim 1, wherein said step (c) comprising:
   (c1) selecting data from a test database and chip parameters;
   (c2) allocating maximum test I/O's with maximum sharing;
   (c3) building maximally configured test controllers;
   (c4) ensuring all legal configurations are viable;
   (c5) ensuring maximum tester time is not exceeded;
   (c6) ensuring maximum test power is not exceeded; and
   (c7) ensuring functional resources are viable.

5. The method of claim 1, further comprising:
   (e) activating an IP block by a user;
   (f) processing test side effect, configuring and connecting pre-allocated I/O's, and connecting a pre-allocated TAP controller; and
   (g) performing logic test connection.

6. The method of claim 5, wherein said step (f) comprising:
   (f1) selecting data related to said IP block;
   (f2) creating I/O's, and resolving I/O conflict; and
   (f3) activating controller structures.

7. The method of claim 5, wherein said step (g) comprising:
   (g1) selecting data related to said IP block;
   (g2) connecting said IP block to I/O's in HDL; and
   (g3) connecting controller structures to said IP block in HDL.

8. An apparatus for automatically configuring and/or inserting chip resources for a manufacturing test, comprising:
   (a) means for pre-associating chip resources with test structures;
   (b) means for determining sharing configuration, trading tester time and power requirements against tester's functional requirements, and taking into account physical requirements;
   (c) means for creating a maximum test configuration; and
   (d) means for loading said maximum test configuration into a tool suite.

9. The apparatus of claim 8, wherein said means (a) comprising:
   (a1) means for selecting an IP block;
   (a2) means for determining test I/O's and storing a first result when said IP block requires one or more chip I/O's; and
   (a3) means for determining controller requirements, resolving and storing a second result when said IP block requires a test controller connection.

10. The apparatus of claim 8, wherein said means (b) comprising:
    (b1) means for selecting chip parameters;
    (b2) means for selecting a common test group;
    (b3) means for determining maximum test power;
    (b4) means for determining a minimum number of test pins per instance of said common test group;
    (b5) means for determining maximum tester time for said common test group;
    (b6) means for determining maximum test resource sharing for said common test group;
    (b7) means for balancing said chip parameters; and
    (b8) means for modifying said chip parameters when a result of said step (b7) is not satisfactory.

11. The apparatus of claim 8, wherein said means (c) comprising:
    (c1) means for selecting data from a test database and chip parameters;
    (c2) means for allocating maximum test I/O's with maximum sharing;
    (c3) means for building maximally configured test controllers;
    (c4) means for ensuring all legal configurations are viable;
    (c5) means for ensuring maximum tester time is not exceeded;
    (c6) means for ensuring maximum test power is not exceeded; and
    (c7) means for ensuring functional resources are viable.

12. The apparatus of claim 8, further comprising:
    (e) means for activating an IP block by a user;
    (f) means for processing test side effect, configuring and connecting pre-allocated I/O's, and connecting a pre-allocated TAP controller; and
    (g) means for performing logic test connection.

13. The apparatus of claim 12, wherein said means (f) comprising:
    (f1) means for selecting data related to said IP block;
    (f2) means for creating I/O's, and resolving I/O conflict; and
    (f3) means for activating controller structures.

14. The apparatus of claim 12, wherein said means (g) comprising:
    (g1) means for selecting data related to said IP block;
    (g2) means for connecting said IP block to I/O's in HDL; and
    (g3) means for connecting controller structures to said IP block in HDL.

15. A computer-readable medium having computer-executable instructions for performing a method, said method comprising:
    (a) pre-associating chip resources with test structures;
    (b) determining sharing configuration, trading tester time and power requirements against tester's functional requirements, and taking into account physical requirements;
    (c) creating a maximum test configuration; and
    (d) loading said maximum test configuration into a tool suite.

16. The computer-readable medium of claim 15, wherein said step (a) comprising:
    (a1) selecting an IP block;
    (a2) determining test I/O's and storing a first result when said IP block requires one or more chip I/O's; and (a3) determining controller requirements, resolving and storing a second result when said IP block requires a test controller connection.

17. The computer-readable medium of claim 15, wherein said step (b) comprising:
   (b1) selecting chip parameters;
   (b2) selecting a common test group;
   (b3) determining maximum test power;
   (b4) determining a minimum number of test pins per instance of said common test group;
   (b5) determining maximum tester time for said common test group;
   (b6) determining maximum test resource sharing for said common test group;
   (b7) balancing said chip parameters; and
   (b8) modifying said chip parameters when a result of said step (b7) is not satisfactory.

18. The computer-readable medium of claim 15, wherein said step (c) comprising:
   (c1) selecting data from a test database and chip parameters;
   (c2) allocating maximum test I/O's with maximum sharing;
   (c3) building maximally configured test controllers;
   (c4) ensuring all legal configurations are viable;
   (c5) ensuring maximum tester time is not exceeded;
   (c6) ensuring maximum test power is not exceeded; and
   (c7) ensuring functional resources are viable.

19. The computer-readable medium of claim 15, wherein said method further comprising:
   (e) activating an IP block by a user;
   (f) processing test side effect, configuring and connecting pre-allocated I/O's, and connecting a pre-allocated TAP controller; and
   (g) performing logic test connection.

20. The computer-readable medium of claim 19, wherein said step (f) comprising:
   (f1) selecting data related to said IP block;
   (f2) creating I/O's, and resolving I/O conflict; and
   (f3) activating controller structures.

21. The computer-readable medium of claim 19, wherein said step (g) comprising:
   (g1) selecting data related to said IP block;
   (g2) connecting said IP block to I/O's in HDL; and
   (g3) connecting controller structures to said IP block in HDL.

* * * * *